(12) United States Patent
Lee et al.

(10) Patent No.: US 10,418,353 B2
(45) Date of Patent: Sep. 17, 2019

(54) STACKED SEMICONDUCTOR PACKAGE HAVING MOLD VIAS AND METHOD FOR MANUFACTURING THE SAME

(71) Applicant: SK hynix Inc., Icheon-si, Gyeonggi-do (KR)

(72) Inventors: Sang-Eun Lee, Yongin-si (KR); Hyung-Dong Lee, Yongin-si (KR); Eun Ko, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/715,449

(22) Filed: Sep. 26, 2017

(65) Prior Publication Data

US 2018/0331087 A1    Nov. 15, 2018

(30) Foreign Application Priority Data

May 11, 2017 (KR) .......................... 10-2017-0058458

(51) Int. Cl.
*H01L 25/18* (2006.01)
*H01L 23/31* (2006.01)
(Continued)

(52) U.S. Cl.
CPC .............. *H01L 25/18* (2013.01); *H01L 21/56* (2013.01); *H01L 21/561* (2013.01);
(Continued)

(58) Field of Classification Search
CPC ... H01L 25/18; H01L 21/563; H01L 23/3128; H01L 25/0652; H01L 24/16;
(Continued)

(56) References Cited

U.S. PATENT DOCUMENTS

| 7,361,533 B1* | 4/2008 | Huemoeller | ........ H01L 23/3128 |
| | | | 438/123 |
| 2008/0116586 A1* | 5/2008 | Kim | .................... H01L 21/4871 |
| | | | 257/778 |

(Continued)

*Primary Examiner* — Marc Anthony Armand
*Assistant Examiner* — Sue Tang
(74) *Attorney, Agent, or Firm* — William Park & Associates Ltd.

(57) ABSTRACT

A stacked semiconductor package includes a first semiconductor chip having a first active surface over which first bonding pads including peripheral bonding pads and central bonding pads are arranged, a first encapsulation member, two second semiconductor chips having second active surfaces over which second bonding pads are arranged at one side peripheries and disposed to be separated from each other such that the second active surfaces face the first active surface and the second bonding pads overlap with the peripheral bonding pads, first coupling members interposed between the peripheral bonding pads and the second bonding pads, a second encapsulation member formed over second side surfaces of the second semiconductor chips including a region between the second semiconductor chips, and a mold via formed through a portion of the second encapsulation member in the region between the second semiconductor chips and coupled with the central bonding pads.

10 Claims, 9 Drawing Sheets

(51) Int. Cl.
*H01L 25/065* (2006.01)
*H01L 23/00* (2006.01)
*H01L 23/48* (2006.01)
*H01L 23/538* (2006.01)
*H01L 21/56* (2006.01)
*H01L 25/00* (2006.01)
*H01L 21/78* (2006.01)
*H01L 23/498* (2006.01)
*H01L 21/768* (2006.01)

(52) U.S. Cl.
CPC .......... *H01L 21/563* (2013.01); *H01L 21/568* (2013.01); *H01L 21/78* (2013.01); *H01L 23/3128* (2013.01); *H01L 23/3135* (2013.01); *H01L 23/3142* (2013.01); *H01L 23/481* (2013.01); *H01L 23/5386* (2013.01); *H01L 24/03* (2013.01); *H01L 24/05* (2013.01); *H01L 24/16* (2013.01); *H01L 24/95* (2013.01); *H01L 25/0652* (2013.01); *H01L 25/50* (2013.01); *H01L 21/76802* (2013.01); *H01L 21/76877* (2013.01); *H01L 23/49816* (2013.01); *H01L 24/81* (2013.01); *H01L 2224/0401* (2013.01); *H01L 2224/0612* (2013.01); *H01L 2224/16145* (2013.01); *H01L 2224/16227* (2013.01); *H01L 2224/16235* (2013.01); *H01L 2225/06513* (2013.01); *H01L 2225/06517* (2013.01); *H01L 2225/06548* (2013.01); *H01L 2225/06562* (2013.01); *H01L 2225/06586* (2013.01); *H01L 2924/1431* (2013.01); *H01L 2924/1434* (2013.01)

(58) Field of Classification Search
CPC .............. H01L 23/3135; H01L 23/481; H01L 23/3142; H01L 23/5386; H01L 21/561; H01L 21/568; H01L 25/50; H01L 24/03; H01L 24/95
USPC .......................................................... 257/737
See application file for complete search history.

(56) References Cited

U.S. PATENT DOCUMENTS

2013/0277855 A1* 10/2013 Kang ................ H01L 23/49816
257/774
2015/0108661 A1* 4/2015 Vincent .................. H01L 24/30
257/777
2016/0293572 A1* 10/2016 We ...................... H01L 25/0652
2016/0358899 A1 12/2016 Lee et al.

* cited by examiner

STACKED SEMICONDUCTOR PACKAGE HAVING MOLD VIAS AND METHOD FOR MANUFACTURING THE SAME

CROSS-REFERENCE TO RELATED APPLICATION

The present application claims priority to Korean Patent Application No. 10-2017-0058458 filed on May 11, 2017, in the Korean Intellectual Property Office, which is incorporated herein by reference in its entirety.

BACKGROUND

1. Technical Field

Various embodiments generally relate to a semiconductor package, and more particularly, to a stacked semiconductor package having mold vias and a method for manufacturing the same.

2. Related Art

As electronic products become smaller and more sophisticated, semiconductor chips with higher capacities have been needed to meet required functions. In addition, it has become necessary to mount an increased number of semiconductor chips in a smaller-sized electronic product.

But, technologies for manufacturing semiconductor chips with higher capacities or mounting an increased number of semiconductor chips in a limited space cannot help but have limitations. In this situation, a recent trend is directed to embedding an increased number of semiconductor chips in one package.

In this regard, technologies capable of embedding different kinds of chips in one package and stacking two or more chips while not increasing the entire thickness of the package are being developed. Also, various technologies capable of improving electrical characteristics of stacked semiconductor chips are being developed.

SUMMARY

In an embodiment, a stacked semiconductor package may include a first semiconductor chip having a first active surface over which first bonding pads including peripheral bonding pads and central bonding pad are arranged. The stacked semiconductor package may include a first encapsulation member formed over at least first side surfaces of the first semiconductor chip. The stacked semiconductor package may include two second semiconductor chips having second active surfaces over which second bonding pads are arranged at side peripheries adjacent to the first semiconductor chip, and disposed to be separated from each other such that the second active surfaces face the first active surface and the second bonding pads overlap with the peripheral bonding pads. The stacked semiconductor package may include first coupling members interposed between the peripheral bonding pads of the first semiconductor chip and the second bonding pads of the second semiconductor chips. The stacked semiconductor package may include a second encapsulation member formed over second side surfaces of the second semiconductor chips including a region between the second semiconductor chips. The stacked semiconductor package may include a mold via formed through a portion of the second encapsulation member in the region between the second semiconductor chips and coupled with the central bonding pads.

In an embodiment, a method for manufacturing a stacked semiconductor package may include: disposing first semiconductor chips having first active surfaces over which first bonding pads including peripheral bonding pads and central bonding pad are arranged, over a carrier wafer such that the carrier wafer and the first active surfaces face each other; forming a first encapsulation member which covers the first semiconductor chips, over the carrier wafer such that a reconfigured wafer in which the first semiconductor chips are redisposed is constructed; removing the carrier wafer from the reconfigured wafer; bonding two second semiconductor chips to one first semiconductor chip on the reconfigured wafer at a distance from each other, wherein the second semiconductor chips have second active surfaces over which second bonding pads are arranged at side peripheries adjacent to the first semiconductor chip, wherein the second semiconductor chips have first coupling members formed on the second bonding pads, wherein the second semiconductor chips possess a thickness greater than a target thickness, and wherein the second semiconductor chips are disposed on the reconfigured wafer, such that the second active surfaces face the first active surface, the second bonding pads are coupled with the peripheral bonding pads by the first coupling members and the central bonding pad is exposed; forming a second encapsulation member over the reconfigured wafer in such a way as to cover the second semiconductor chips; removing a partial thickness of the second encapsulation member and the second semiconductor chips such that the target thickness of the second semiconductor chips remains; and forming a mold via which is coupled with the central bonding pads of the first semiconductor chip, and which pass through a portion of the second encapsulation member in a region between the second semiconductor chips.

DETAILED DESCRIPTION

Hereinafter, a stacked semiconductor package having mold vias and a method for manufacturing the same will be described below with reference to the accompanying drawings through various examples of embodiments.

Embodiments provide a stacked semiconductor package having mold vias and a method for manufacturing the same.

Figure 1:
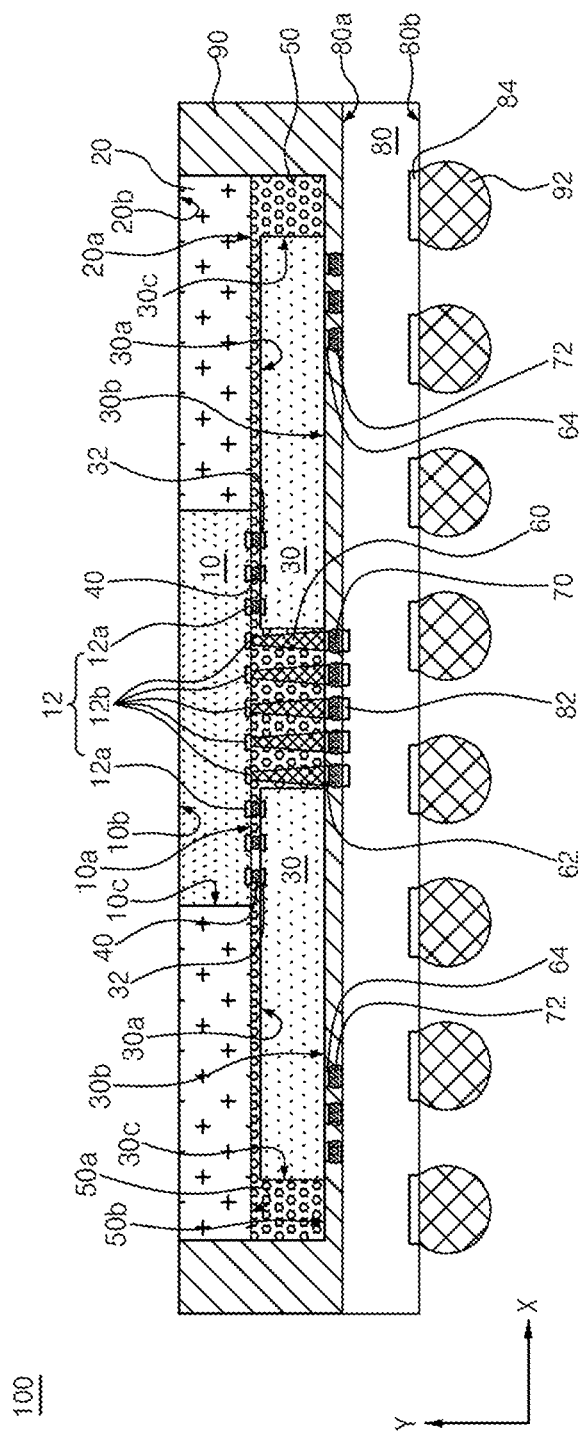
FIG. 1 is a cross-sectional view illustrating a representation of an example of a stacked semiconductor package in accordance with an embodiment.

Referring to FIG. 1, a stacked semiconductor package 100 in accordance with an embodiment may include a first semiconductor chip 10, a first encapsulation member 20, second semiconductor chips 30, first coupling members 40, a second encapsulation member 50, mold vias 60, second coupling members 70, and a substrate 80. The stacked semiconductor package 100 may further include bump pads 62, dummy pads 64, and support members 72. The stacked semiconductor package 100 may further include a third encapsulation member 90 and external coupling members 92.

The first semiconductor chip 10 may be either a memory chip or a logic chip. For example, the first semiconductor chip 10 may be a logic chip. The first semiconductor chip 10 may have a quadrangular plate shape. The first semiconductor chip 10 may have a first active surface 10a and a first surface 10b which faces away from the first active surface 10a. The first semiconductor chip 10 may include a plurality of first bonding pads 12 which are arranged in the form of a matrix on the first active surface 10a.

The first bonding pads 12 may be disposed in the first active surface 10a. Unlike this, the first bonding pads 12 may be disposed on the first active surface 10a. When viewed in a first direction X, the first bonding pads 12 may be divided into peripheral bonding pads 12a which are disposed at both side peripheries of the first active surface 10a and central bonding pads 12b which are disposed between the peripheral bonding pads 12a of the first active surface 10a. In an embodiment, the peripheral bonding pads 12a may be arranged in three lines at each side periphery of the first active surface 10a, and the central bonding pads 12b may be arranged in five lines between the peripheral bonding pads 12a disposed at both side peripheries of the first active surface 10a.

The first semiconductor chip 10 may be disposed in a face-down type such that the first active surface 10a on which the first bonding pads 12 are arranged faces downward.

While not shown, it may be understood that the first semiconductor chip 10 is formed with a passivation layer on the first active surface 10a in such a way as to leave the first bonding pads 12 exposed.

The first encapsulation member 20 may be formed to cover first side surfaces 10c of the first semiconductor chip 10. The first encapsulation member 20 may be formed to not cover the first active surface 10a and the first surface 10b of the first semiconductor chip 10. A first front surface 20a of the first encapsulation member 20 may be disposed to be coplanar with the first active surface 10a of the first semiconductor chip 10, and a first back surface 20b of the first encapsulation member 20 may be disposed to be coplanar with the first surface 10b of the first semiconductor chip 10. The first encapsulation member 20 may be formed of an epoxy molding compound. While not shown, in other embodiments the first encapsulation member 20 may be formed in such a way as to not cover the first active surface 10a of the first semiconductor chip 10 and to cover the first surface 10b and the first side surfaces 10c of the first semiconductor chip 10. According to this fact, the first surface 10b of the first semiconductor chip 10 may be protected from external circumstances by the first encapsulation member 20.

The second semiconductor chips 30 may be disposed under the first semiconductor chip 10 and the first encapsulation member 20 in a second direction Y. Two second semiconductor chips 30 may be disposed in this manner. Each of the second semiconductor chips 30 may have a quadrangular plate shape. Each of the second semiconductor chips 30 may have a second active surface 30a and a second surface 30b which faces away from the second active surface 30a. Each of the second semiconductor chips 30 may include a plurality of second bonding pads 32 which are arranged on the second active surface 30a.

In each of the second semiconductor chips 30, the second bonding pads 32 may be disposed at one side periphery which is adjacent to the first semiconductor chip 10 when viewed in the first direction X. For example, in the second semiconductor chip 30 which is disposed at the lower left of the first semiconductor chip 10, the second bonding pads 32 may be disposed at the right side periphery of the second active surface 30a, and in the second semiconductor chip 30 which is disposed at the lower right of the first semiconductor chip 10, the second bonding pads 32 may be disposed at the left side periphery of the second active surface 30a.

The second semiconductor chips 30 may be disposed in a face-up type under the first semiconductor chip 10 and the first encapsulation member 20 such that the second active surfaces 30a of the second semiconductor chips 30 face the first active surface 10a of the first semiconductor chip 10. The second semiconductor chips 30 may be disposed to be separated from each other such that the second semiconductor chips 30 overlap with the peripheral bonding pads 12a of the first semiconductor chip 10 and leave exposed the central bonding pads 12b of the first semiconductor chip 10. The peripheral bonding pads 12a of the first semiconductor chip 10 and the second bonding pads 32 of the second semiconductor chips 30 may overlap with each other in a one-to-one correspondence.

The second semiconductor chips 30 may be a kind of chip that is different from the first semiconductor chip 10. For example, if the first semiconductor chip 10 is a logic chip, the second semiconductor chips 30 may be memory chips. While not shown, it may be understood that each of the second semiconductor chips 30 is formed with a passivation layer on the second active surface 30a in such a way as to leave the second bonding pads 32 exposed. The second bonding pads 32 may be disposed in the second active surfaces 30a as illustrated. Unlike this, while not shown, in other embodiments the second bonding pads 32 may be disposed on the second active surfaces 30a.

The first coupling members 40 may be respectively interposed between the peripheral bonding pads 12a of the first semiconductor chip 10 and the second bonding pads 32 of the second semiconductor chips 30 in such a way as to electrically couple the peripheral bonding pads 12a and the second bonding pads 32, which are disposed to overlap with each other. The first coupling members 40 may be constructed by bumps. The first coupling members 40 may be formed on the second bonding pads 32 of the second semiconductor chips 30. The second semiconductor chips 30 may be flip-chip bonded to the first active surface 10a of the first semiconductor chip 10 by the first coupling members 40.

The second encapsulation member 50 may be formed to cover the second active surfaces 30a and second side surfaces 30c of the second semiconductor chips 30. The second encapsulation member 50 may be formed to not cover the second surfaces 30b of the second semiconductor chips 30. The second encapsulation member 50 may be formed to fill the region between the second semiconductor chips 30. A second front surface 50a of the second encapsulation member 50 may be disposed to be in contact with the first active surface 10a of the first semiconductor chip 10 and the first front surface 20a of the first encapsulation member 20, and a second back surface 50b of the second encapsulation member 50 may be disposed to be coplanar with the second surfaces 30b of the second semiconductor chips 30. The second encapsulation member 50 may be formed of an epoxy molding compound in the same manner as the first encapsulation member 20. The total width of the second encapsulation member 50 and the second semiconductor chips 30 may be substantially the same as the total width of the first semiconductor chip 10 and the first encapsulation member 20.

The mold vias 60 may be formed to electrically couple the first semiconductor chip 10 and the substrate 80. The mold vias 60 may be formed through a portion of the second encapsulation member 50 between the second semiconductor chips 30. The mold vias 60 may be formed to pass through the second front surface 50a and the second back surface 50b of the second encapsulation member 50. The mold vias 60 may be coupled with the central bonding pads 12b of the first semiconductor chip 10 on the second front surface 50a of the second encapsulation member 50. The mold vias 60 may be formed as through holes are formed in the second encapsulation member 50 and then a conductive layer such as a metal layer is filled in the through holes.

In the embodiment, the bump pads 62 may be formed on or under the portions of the mold vias 60 which are disposed at the second back surface 50b of the second encapsulation member 50. The dummy pads 64 may be formed under and at the side peripheries of the second surfaces 30b of the second semiconductor chips 30 which are not adjacent to the mold vias 60 when viewed in the first direction X. The bump pads 62 and the dummy pads 64 may be formed as a metal pattern.

The second coupling members 70 may be formed on or under the bump pads 62. The support members 72 may be formed on or under the dummy pads 64. The second coupling members 70 and the support members 72 may be constructed by bumps. By the second coupling members 70, a chip stack including the first semiconductor chip 10, the first encapsulation member 20, the second semiconductor chips 30, and the second encapsulation member 50 may be flip-chip bonded to a top surface 80a of the substrate 80. The stack of the dummy pads 64 and the support members 72 may be formed to secure structural stability when flip-chip bonding the chip stack, and may be disposed at the side peripheries of the second surfaces 30b of the second semiconductor chips 30 which are not adjacent to the mold vias 60 when viewed in the first direction X.

The substrate 80 may be disposed under the second semiconductor chips 30 and the second encapsulation member 50. The substrate 80 may be disposed to face the second surfaces 30b of the second semiconductor chips 30 and the second back surface 50b of the second encapsulation member 50. The substrate 80 may be a printed circuit board, and have a quadrangular plate shape. The substrate 80 may have a size larger than the total size of the second semiconductor chips 30 and the second encapsulation member 50. The substrate 80 may have the top surface 80a and a bottom surface 80b which faces away from the top surface 80a. The substrate 80 may include a plurality of bond fingers 82 which are arranged on the top surface 80a and a plurality of electrode terminals 84 which are arranged on or under the bottom surface 80b.

The bond fingers 82 may be disposed at the center portion of the top surface 80a of the substrate 80. The bond fingers 82 may be disposed in such a way as to overlap with the mold vias 60 corresponding thereto. Accordingly, the bond fingers 82 may be electrically coupled with the mold vias 60 including the bump pads 62 by the second coupling members 70. As a result, the bond fingers 82 may be electrically coupled with the central bonding pads 12b of the first semiconductor chip 10 through the second coupling members 70, the bump pads 62, and the mold vias 60.

The electrode terminals 84 may be arranged, for example, in the form of a matrix, on or under the bottom surface 80b of the substrate 80. The electrode terminals 84 may be coupled with internal wiring lines (not shown) which are formed in the substrate 80, and may be electrically coupled with the bond fingers 82 which are arranged on the top surface 80a of the substrate 80, through the internal wiring lines.

The third encapsulation member 90 may be formed on or over the top surface 80a of the substrate 80. More clearly, the third encapsulation member 90 may be formed to not cover the first back surface 20b of the first encapsulation member 20 and the first surface 10b of the first semiconductor chip 10. The third encapsulation member 90 may be formed to cover the side surfaces of the first encapsulation member 20 and the second encapsulation member 50. The third encapsulation member 90 may be formed to fill the spaces between the second semiconductor chips 30 and the top surface 80a of the substrate 80. The third encapsulation member 90 may be formed of an epoxy molding compound. While not shown, in other embodiments the third encapsulation member 90 may be formed to cover the first surface 10b of the first semiconductor chip 10 and the first back surface 20b of the first encapsulation member 20.

The external coupling members 92 may be formed on or under the electrode terminals 84 which are arranged on the bottom surface 80b of the substrate 80. The external coupling members 92 may include solder balls. Unlike this, the external coupling members 92 may include conductive pins or conductive pastes. The stacked semiconductor package 100 in accordance with the embodiment may be mounted to an external circuit such as a system board by the medium of the external coupling members 92.

The stacked semiconductor package 100 in accordance with the embodiment as mentioned above may be manufactured through the following processes.

Figure 2A:
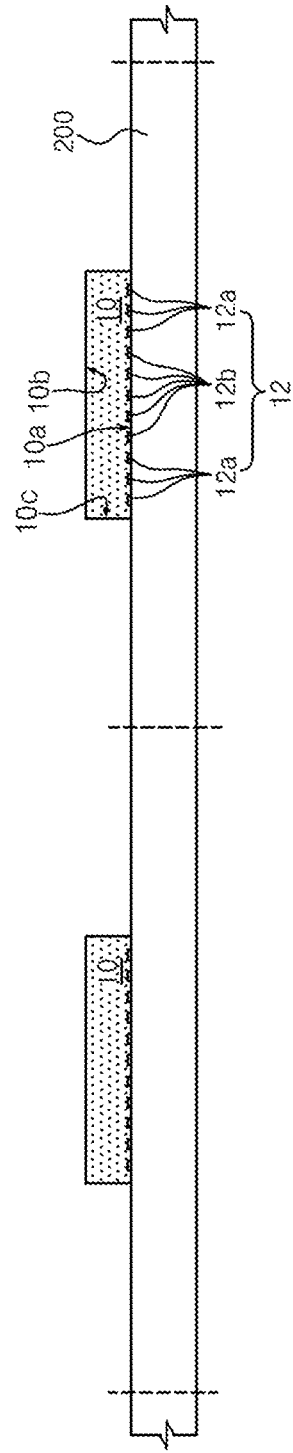
FIGS. 2A to 2J are representations of examples of cross-sectional views to assist in the explanation of the processes of a method for manufacturing a stacked semiconductor package in accordance with an embodiment.

Referring to FIG. 2A, a carrier wafer 200 is prepared. The carrier wafer 200 may be an unprocessed silicon bare wafer. First semiconductor chips 10 having first active surfaces 10a are attached to the carrier wafer 200. Each of semiconductor chips are formed with first bonding pads 12 on the first active surface 10a. The first semiconductor chips 10 may be attached on or over the carrier wafer 200 such that the first active surfaces 10a face the carrier wafer 200. Further, the first semiconductor chips 10 are attached at intervals that are determined in consideration of second semiconductor chips to be subsequently flip-chip bonded.

Each of the first semiconductor chips 10 has the first active surface 10a which is formed with the plurality of first bonding pads 12, a first surface 10b which faces away from the first active surface 10a, and first side surfaces 10c which couple the first active surface 10a and the first surface 10b. The first bonding pads 12 include peripheral bonding pads 12a which are disposed at both side peripheries of the first active surface 10a and central bonding pads 12b which are disposed between the peripheral bonding pads 12a.

Figure 2B:
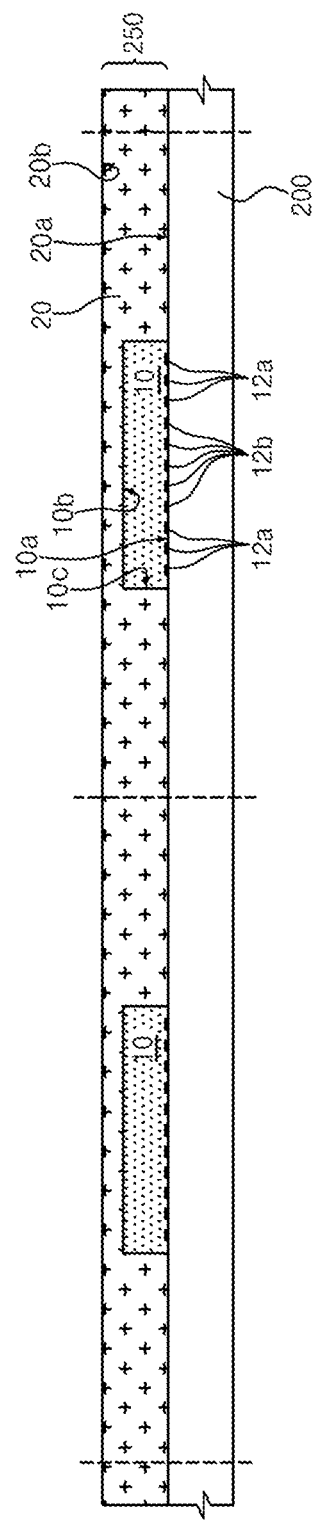

Referring to FIG. 2B, a first encapsulation member 20 is formed on the carrier wafer 200 through a molding process in such a way as to cover the first semiconductor chips 10. The first encapsulation member 20 may be an epoxy molding compound, and is formed to cover the first side surfaces 10c and the first surface 10b of each first semiconductor chip 10. The first encapsulation member 20 has a first front surface 20a which is coplanar with the first active surface 10a of each first semiconductor chip 10. Further, the first encapsulation member 20 may be formed over and may be in contact with the carrier wafer 200. The first encapsulation member 20 has a first back surface 20b which faces away from the first front surface 20a.

Here, a resultant product in which the plurality of first semiconductor chips 10 are redisposed by the first encapsulation member 20 is referred to as a reconfigured wafer 250.

Figure 2C:
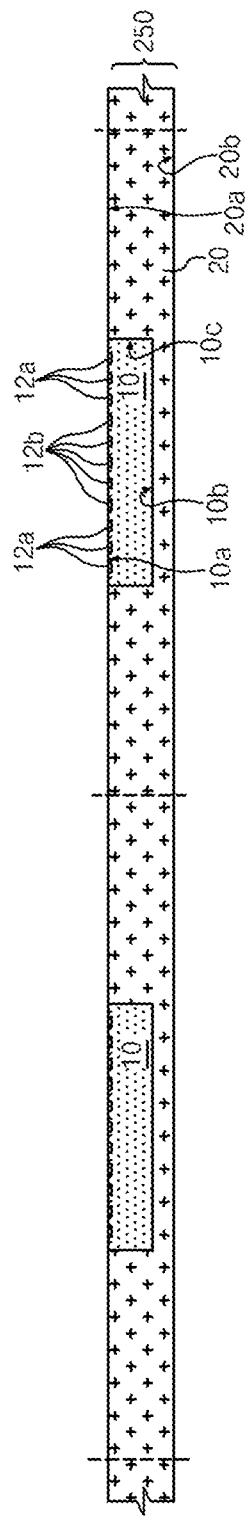

Referring to FIG. 2C, the carrier wafer 200 is removed from the reconfigured wafer 250 including the first semiconductor chips 10 and the first encapsulation member 20. Then, the reconfigured wafer 250 from which the carrier wafer 200 is removed is disposed upside down such that the first active surfaces 10a of the first semiconductor chips 10 are positioned up.

Figure 2D:
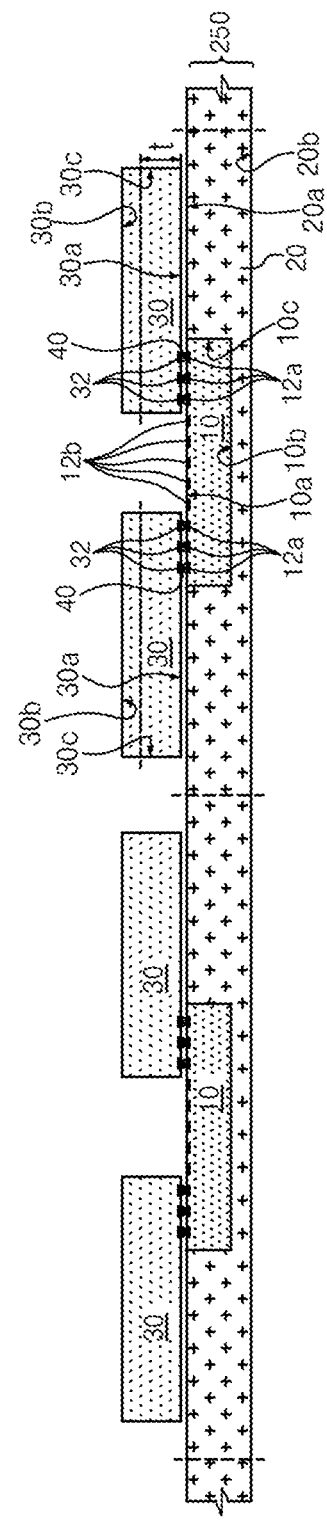

Referring to FIG. 2D, second semiconductor chips 30 are prepared. Each of the second semiconductor chips have a second active surface 30a on or over which a plurality of second bonding pads 32 are arranged, a second surface 30b which faces away from the second active surface 30a and second side surfaces 30c which couple the second active surface 30a and the second surface 30b. The second bonding pads 32 may be arranged at one side periphery of the second active surface 30a which is adjacent to the first semiconductor chips 10. First coupling members 40 are formed on the second bonding pads 32 of the second semiconductor chips 30. The first coupling members 40 may be constructed by bumps. In an embodiment, in order to ensure easy handling, the second semiconductor chips 30 have a thickness greater than a target thickness t, that is, a thickness of the second semiconductor chips 30 in a final stacked semiconductor package.

The second semiconductor chips 30 are flip-chip bonded to the reconfigured wafer 250 by the first coupling members 40 according to a wafer level package technology such that the first active surfaces 10a of the first semiconductor chips 10 and the second active surfaces 30a of the second semiconductor chips 30 face each other. More clearly, two second semiconductor chips 30 are flip-chip bonded to one first semiconductor chip 10 by the first coupling members 40 such that the two second semiconductor chips 30 overlap with the peripheral bonding pads 12a of the first active surface 10a with respect to the one first semiconductor chip 10. Accordingly, the peripheral bonding pads 12a of the first semiconductor chips 10 and the second bonding pads 32 of the second semiconductor chips 30 are electrically coupled with each other by the first coupling members 40, and the central bonding pads 12b of the first semiconductor chips 10 are exposed through the regions between two second semiconductor chips 30.

Figure 2E:
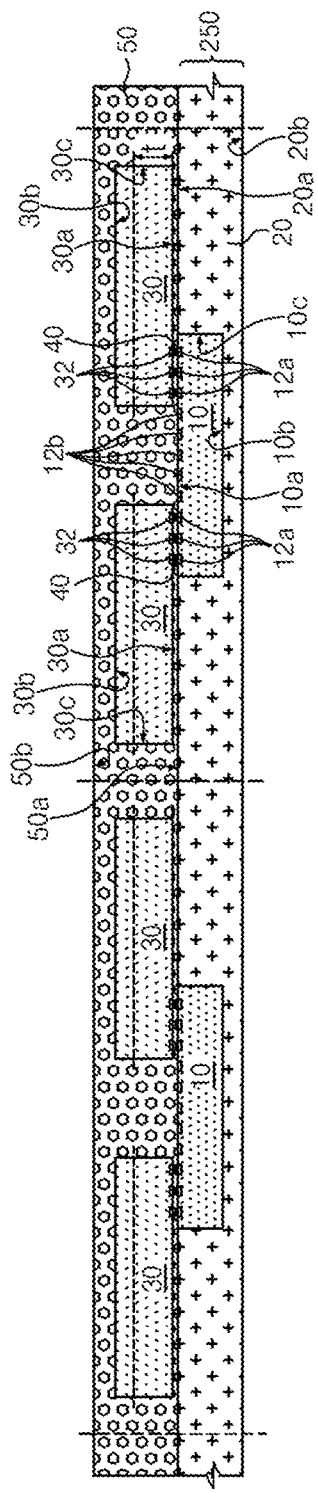

Referring to FIG. 2E, a second encapsulation member 50 is formed on or over the reconfigured wafer 250 to cover the second semiconductor chips 30. The second encapsulation member 50 may be an epoxy molding compound. The second encapsulation member 50 is formed to fill the spaces between the first semiconductor chips 10 and the second semiconductor chips 30 and the spaces between the first encapsulation member 20 and the second semiconductor chips 30, and is formed to fill the regions between the second semiconductor chips 30. The second encapsulation member 50 has a second front surface 50a which is in contact with the first encapsulation member 20 and a second back surface 50b which faces away from the second front surface 50a.

Figure 2F:
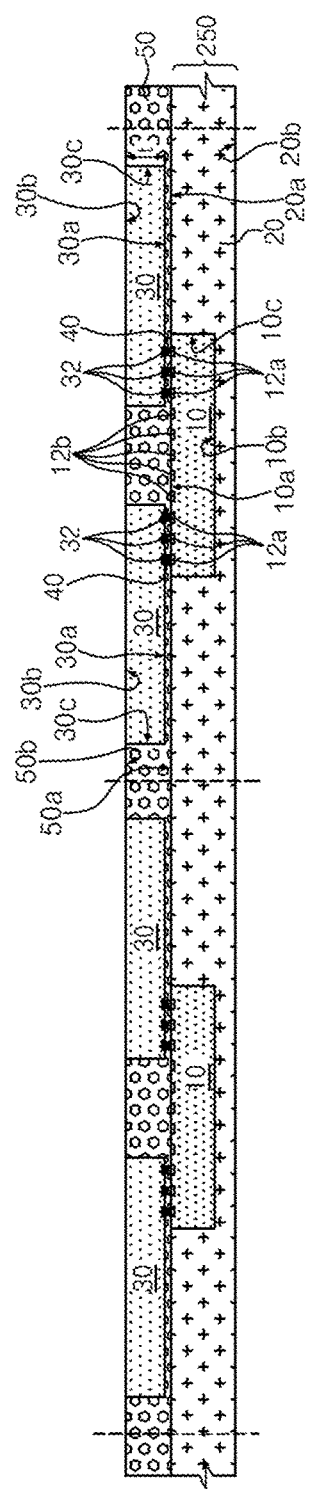

Referring to FIG. 2F, the second encapsulation member 50 and the second semiconductor chips 30 are partially removed up to the target thickness t of the second semiconductor chips 30. The partial removal of the second encapsulation member 50 and the second semiconductor chips 30 may be performed through, for example, a grinding process. In FIG. 2F, the second back surface 50b of the final second encapsulation member 50 and the second surfaces 30b of the final second semiconductor chips 30 are the exposed surfaces with some thickness removed, respectively. While not shown, after partially removing the second encapsulation member 50 and the second semiconductor chips 30, the partial removal of the first back surface 20b of the first encapsulation member 20 may be performed such that the first surfaces 10a of the first semiconductor chips 10 are exposed.

Figure 2G:
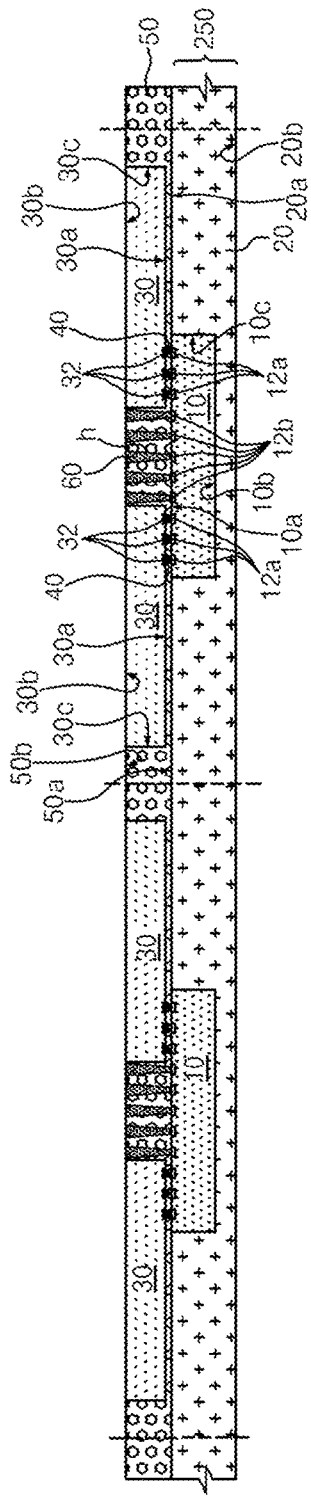

Referring to FIG. 2G, portions of the second encapsulation member 50 between the second semiconductor chips 30 are etched such that holes h which respectively expose the central bonding pads 12b of the first semiconductor chips 10 are formed. As a conductive layer such as a metal layer is filled in the holes h, mold vias 60 are formed in the holes h, respectively. The mold vias 60 are formed to pass through the second front surface 50a and the second back surface 50b of the second encapsulation member 50 in a region between the second semiconductor chips 30, and are electrically coupled with the central bonding pads 12b, respectively, of the first semiconductor chips 10.

Figure 2H:
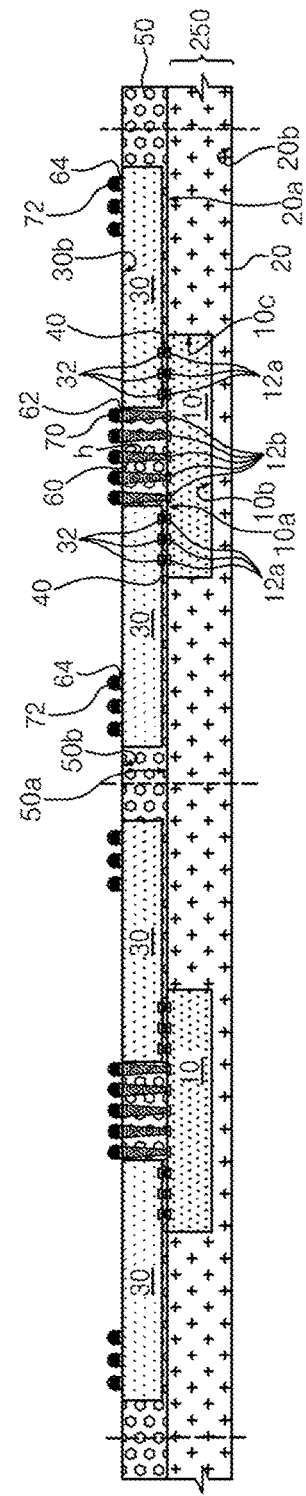

Referring to FIG. 2H, bump pads 62 are formed on or over the mold vias 60 which are disposed at the second back surface 50b of the second encapsulation member 50, and, at the same time, dummy pads 64 are formed on or over the second back surfaces 30b of the second semiconductor chips 30. The bump pads 62 and the dummy pads 64 may be formed of a metal. Second coupling members 70 are formed on or over the bump pads 62, and, at the same time, support members 72 are formed on or over the dummy pads 64. The second coupling members 70 and the support members 72 may be constructed by, for example, bumps.

In the embodiment, the dummy pads 64 and the support members 72 may be formed to secure structural stability when subsequently flip-chip bonding chip stacks by the medium of the second coupling members 70. The dummy pads 64 and the support members 72 may be disposed at the side peripheries of the second surfaces 30b of the second semiconductor chips 30 which are not adjacent to the mold vias 60.

Figure 2I:
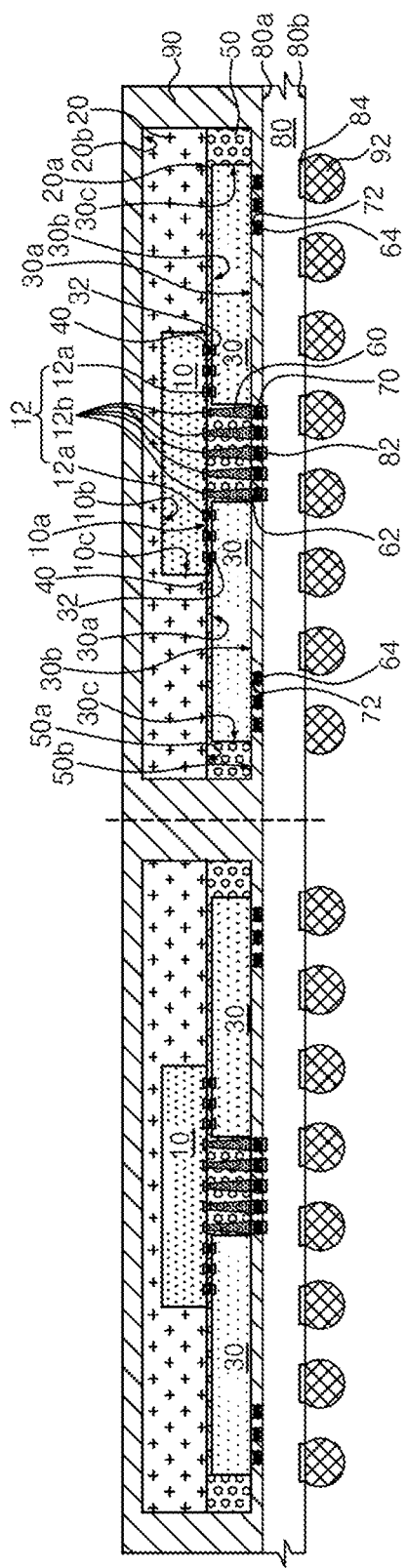

Referring to FIG. 2I, A resultant product with the dummy pads 64 and support members 72 is sawed such that the resultant product is separated into a plurality of chip stacks. The chip stacks include the first and second semiconductor chips 10 and 30, the first and second encapsulation members 20 and 50, and the mold vias 60, respectively.

A substrate 80 is prepared. The substrate 80 has a top surface 80a on which a plurality of bond fingers 82 are arranged and a bottom surface 80b which faces away from the top surface 80a and on which a plurality of electrode terminals 84 are arranged. The chip stacks are flip-chip bonded to the top surface 80a of the substrate 80 such that the top surface 80a of the substrate 80 and the second surfaces 30b of the second semiconductor chips 30 face each other. Here, the chip stacks are bonded such that the second coupling members 70 are coupled with the bond fingers 82 of the substrate 80. Accordingly, the first bonding pads 12 of the first semiconductor chips 10 are electrically coupled with the bond fingers 82 of the substrate 80 by the medium of the mold vias 60, the bump pads 62 and the second coupling members 70. When flip-chip bonding the chip stacks, the support members 72 including the dummy pads 64 are brought into contact with both side peripheries of the top surface 80a of the substrate 80, and accordingly, the structural stability of the chip stacks is secured.

A third encapsulation member 90 is formed through a molding process on or over the substrate 80 such that the chip stacks are completely covered. The third encapsulation member 90 may be formed to cover the side surfaces of the first encapsulation member 20 and the second encapsulation member 50 and fill the spaces between the second semiconductor chips 30 and the substrate 80. The third encapsulation member 90 may be formed of an epoxy molding compound.

Figure 2J:
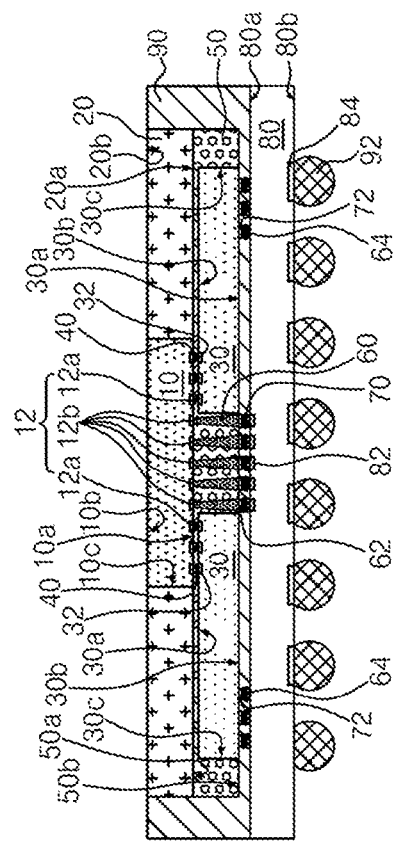

Referring to FIG. 2J, the third encapsulation member 90 and the first back surface 20b of the first encapsulation member 20 are partially removed such that the first surfaces 10b of the first semiconductor chips 10 are exposed. The partial removal of the third encapsulation member 90 and the first encapsulation member 20 may be performed through, for example, a grinding process. Here, the first back surface 20b of the final first encapsulation member 20 is the exposed surface with some thickness removed. External coupling members 92 are formed on the electrode terminals 84, respectively, which are arranged on or under the bottom surface 80b of the substrate 80. The external coupling members 92 may be solder balls. A singulation process is performed for a resultant product in which the external coupling members 92 are formed in such a manner that the packages which are manufactured at a wafer level are separated into individual packages. As a result, the manufacturing of a stacked semiconductor package 100 in accordance with the embodiment is completed.

The stacked semiconductor package 100 in accordance with the embodiment as mentioned above has advantages in that it is possible to reduce the manufacturing cost and simplify the manufacturing process.

In detail, in the conventional art, a silicon interposer is needed to implement a planar type stacked package, and TSVs (through-silicon vias) are needed to implement a vertical type stacked package. If a silicon interposer is applied, an increase in the manufacturing cost cannot help but be caused due to the presence of the silicon interposer, and a burden is imposed in terms of signal routing. Similarly, even in the case where TSVs are applied, a burden is imposed due to a complicated process and an increase in the manufacturing cost cannot help but be caused.

However, in the case of the stacked semiconductor package 100 in accordance with the embodiment, second semiconductor chips may be stacked in a planar type without the need of applying a silicon interposer, and a first semiconductor chip and second semiconductor chips may be stacked in a vertical type without the need of applying TSVs. As a consequence, in the stacked semiconductor package 100 in accordance with the embodiment, an increase in the manufacturing cost attributable to application of a silicon interposer and TSVs may be avoided, and a burden in process due to signal routing and forming of complicated TSVs may be avoided.

Therefore, the stacked semiconductor package 100 in accordance with the embodiment may overcome commercial and technical limitations in comparison with the conventional art in which a silicon interposer, signal routing, and TSVs should be applied.

Figure 3:
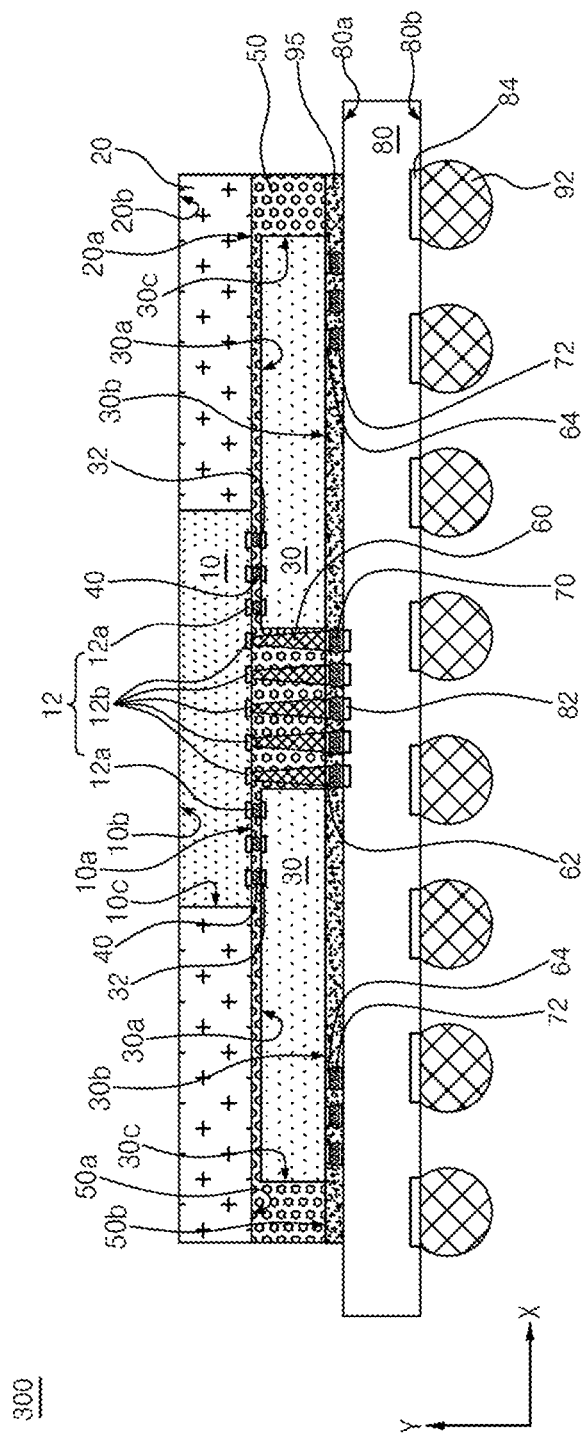
FIG. 3 is a cross-sectional view illustrating a representation of an example of a stacked semiconductor package in accordance with an embodiment.

Referring to FIG. 3, a stacked semiconductor package 300 in accordance with an embodiment may include a first semiconductor chip 10, a first encapsulation member 20, second semiconductor chips 30, first coupling members 40, a second encapsulation member 50, mold vias 60, second coupling members 70, a substrate 80, and an underfill 95.

The stacked semiconductor package 300 may further include external coupling members 92.

The first semiconductor chip 10 may be either a memory chip or a logic chip. For example, the first semiconductor chip 10 may be a logic chip. The first semiconductor chip 10 may have a first active surface 10a and a first surface 10b which faces away from the first active surface 10a. The first semiconductor chip 10 may include a plurality of first bonding pads 12 which are arranged on the first active surface 10a. When viewed in a first direction X, the first bonding pads 12 may include peripheral bonding pads 12a which are disposed at both side peripheries of the first active surface 10a and central bonding pads 12b which are disposed between the peripheral bonding pads 12a of the first active surface 10a. The first semiconductor chip 10 may be disposed in a face-down type such that the first active surface 10a on which the first bonding pads 12 are arranged faces downward.

The first encapsulation member 20 may be formed to cover first side surfaces 10c of the first semiconductor chip 10. The first encapsulation member 20 may be formed to not cover the first active surface 10a and the first surface 10b of the first semiconductor chip 10. The first encapsulation member 20 may be formed of an epoxy molding compound.

Two second semiconductor chips 30 may be disposed under the first semiconductor chip 10 and the first encapsulation member 20 in a second direction Y. Each of the second semiconductor chips 30 may have a second active surface 30a and a second surface 30b which faces away from the second active surface 30a. The second semiconductor chips 30 may be disposed such that the second active surfaces 30a of the second semiconductor chips 30 face the first active surface 10a of the first semiconductor chip 10. Each of the second semiconductor chips 30 may include a plurality of second bonding pads 32 which are arranged on the second active surface 30a. The second bonding pads 32 of each of the second semiconductor chips 30 may be disposed at one side periphery of the second active surface 30a which is adjacent to the first semiconductor chip 10 when viewed in the first direction X.

The two second semiconductor chips 30 may be disposed to be separated from each other in such a manner that the side peripheries of the second active surfaces 30a at which the second bonding pads 32 are arranged overlap with the peripheral bonding pads 12a of the first semiconductor chip 10 leaving the central bonding pads 12b of the first semiconductor chip 10 exposed. The second bonding pads 32 of the second semiconductor chips 30 may be disposed to overlap with the peripheral bonding pads 12a of the first semiconductor chip 10 in a one-to-one correspondence.

The second semiconductor chips 30 may be a kind of chip that is different from the first semiconductor chip 10. For example, if the first semiconductor chip 10 is a logic chip, the second semiconductor chips 30 may be memory chips.

The first coupling members 40 may be interposed between the peripheral bonding pads 12a of the first semiconductor chip 10 and the second bonding pads 32 of the second semiconductor chips 30. The first coupling members 40 may be constructed by bumps. The first coupling members 40 may be formed on the second bonding pads 32 of the second semiconductor chips 30. The second semiconductor chips 30 may be flip-chip bonded to the first active surface 10a of the first semiconductor chip 10 by the first coupling members 40.

The second encapsulation member 50 may be formed to cover the second active surfaces 30a and second side surfaces 30c of the second semiconductor chips 30. The second encapsulation member 50 may be formed to not cover the second surfaces 30b of the second semiconductor chips 30. The second encapsulation member 50 may be formed to fill the region between the second semiconductor chips 30. The second encapsulation member 50 may be formed of an epoxy molding compound.

The mold vias 60 may be formed through a portion of the second encapsulation member 50 between the second semiconductor chips 30. The mold vias 60 may be formed to pass through a second front surface 50a and a second back surface 50b of the second encapsulation member 50. The mold vias 60 may be coupled with the central bonding pads 12b, respectively, of the first semiconductor chip 10 on the second front surface 50a of the second encapsulation member 50.

Bump pads 62 may be formed on or under the portions of the mold vias 60 which are disposed at the second back surface 50b of the second encapsulation member 50. Dummy pads 64 may be formed under and at the side peripheries of the second surfaces 30b of the second semiconductor chips 30 which are not adjacent to the mold vias 60 when viewed in the first direction X. The bump pads 62 and the dummy pads 64 may be formed as a metal pattern.

The second coupling members 70 may be formed on or under the bump pads 62. Support members 72 may be formed on or under the dummy pads 64. The second coupling members 70 and the support members 72 may be constructed by bumps. By the second coupling members 70, a chip stack including the first semiconductor chip 10, the first encapsulation member 20, the second semiconductor chips 30, and the second encapsulation member 50 may be flip-chip bonded to a top surface 80a of the substrate 80. The stack of the dummy pads 64 and the support members 72 may be formed to secure structural stability when flip-chip bonding the chip stack, The stack of the dummy pads 64 and the support members 72 may be disposed at the side peripheries of the second surfaces 30b of the second semiconductor chips 30 which are not adjacent to the mold vias 60 when viewed in the first direction X.

The substrate 80 may be disposed under the second semiconductor chips 30 and the second encapsulation member 50. That is, the substrate 80 may be disposed to face the second surfaces 30b of the second semiconductor chips 30 and the second back surface 50b of the second encapsulation member 50. The substrate 80 may be a printed circuit board, and have a quadrangular plate shape. The substrate 80 may have the top surface 80a and a bottom surface 80b which faces away from the top surface 80a. The substrate 80 may include a plurality of bond fingers 82 which are arranged on the top surface 80a and a plurality of electrode terminals 84 which are arranged on or under the bottom surface 80b.

The bond fingers 82 may be disposed at the center portion of the top surface 80a of the substrate 80. The bond fingers 82 may be disposed in such a way as to overlap with the mold vias 60 corresponding thereto. Accordingly, the bond fingers 82 may be electrically coupled with the mold vias 60 including the bump pads 62 by the second coupling members 70. As a result, the bond fingers 82 may be electrically coupled with the central bonding pads 12b of the first semiconductor chip 10 through the second coupling members 70, the bump pads 62, and the mold vias 60.

The electrode terminals 84 may be arranged on or under the bottom surface 80b of the substrate 80. The electrode terminals 84 may be electrically coupled with the bond fingers 82 which are arranged on the top surface 80a of the substrate 80, through internal wiring lines (not shown) which are formed in the substrate 80.

The underfill 95 may be formed to fill the space between the chip stack and the substrate 80. More clearly, the underfill 95 may be formed to fill the spaces between the second surfaces 30b of the second semiconductor chips 30 on which the stacks of the bump pads 62 and the second coupling members 70 and the stacks of the dummy pads 64 and the support members 72 are disposed, and the second back surface 50b of the second encapsulation member 50 and the top surface 80a of the substrate 80. The underfill 95 may include an epoxy constituent.

The external coupling members 92 may be formed on or under the electrode terminals 84 which are arranged on the bottom surface 80b of the substrate 80. The external coupling members 92 may include solder balls. Unlike this, the external coupling members 92 may include conductive pins or conductive pastes.

Figure 4:
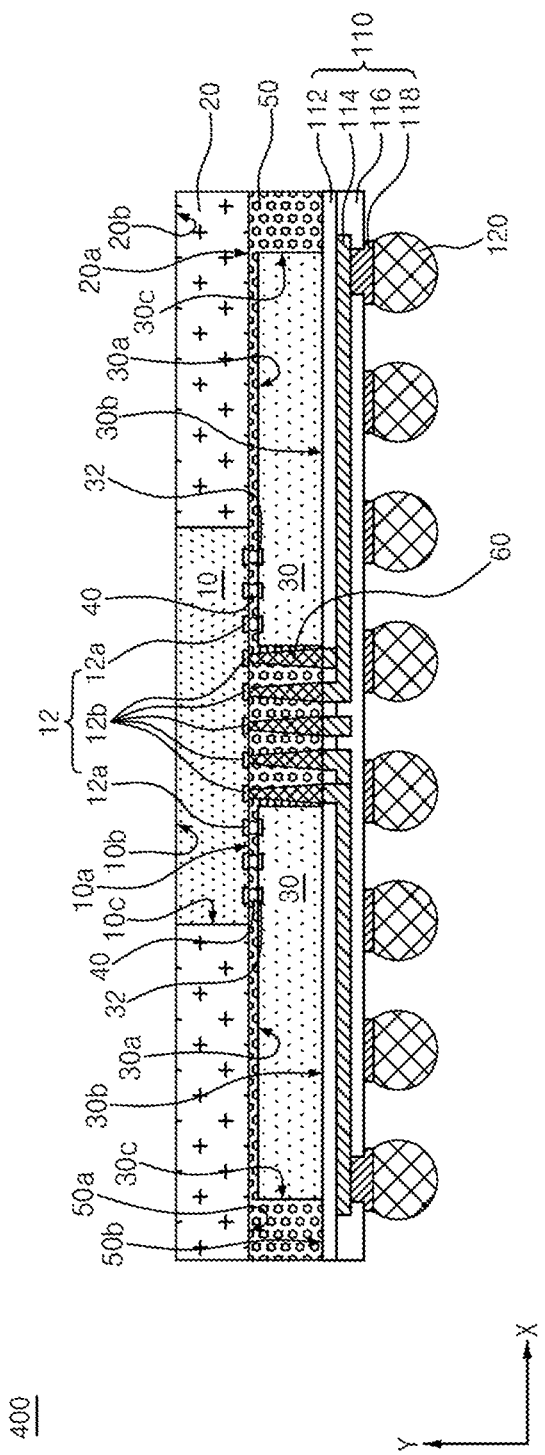
FIG. 4 is a cross-sectional view illustrating a representation of an example of a stacked semiconductor package in accordance with an embodiment.

Referring to FIG. 4, a stacked semiconductor package 400 in accordance with an embodiment may include a first semiconductor chip 10, a first encapsulation member 20, second semiconductor chips 30, first coupling members 40, a second encapsulation member 50, mold vias 60, and a redistribution layer 110. The stacked semiconductor package 400 may further include external coupling members 120.

The first semiconductor chip 10 may be either a memory chip or a logic chip. For example, the first semiconductor chip 10 may be a logic chip. The first semiconductor chip 10 may have a first active surface 10a and a first surface 10b which faces away from the first active surface 10a. The first semiconductor chip 10 may include a plurality of first bonding pads 12 which are arranged on the first active surface 10a. When viewed in a first direction X, the first bonding pads 12 may include peripheral bonding pads 12a which are disposed at both side peripheries of the first active surface 10a and central bonding pads 12b which are disposed between the peripheral bonding pads 12a. The first semiconductor chip 10 may be disposed in a face-down type such that the first active surface 10a on which the first bonding pads 12 are arranged faces downward.

The first encapsulation member 20 may be formed to cover first side surfaces 10c of the first semiconductor chip 10. The first encapsulation member 20 may be formed to not cover the first active surface 10a and the first surface 10b of the first semiconductor chip 10. The first encapsulation member 20 may be formed of an epoxy molding compound.

The second semiconductor chips 30 may be disposed under the first semiconductor chip 10 and the first encapsulation member 20 in a second direction Y. Two second semiconductor chips may be disposed. Each of the second semiconductor chips 30 may have a second active surface 30a and a second surface 30b which faces away from the second active surface 30a. Each of the second semiconductor chips 30 may include a plurality of second bonding pads 32 which are arranged on the second active surface 30a. The second bonding pads 32 of each of the second semiconductor chips 30 may be disposed at one side periphery of the second active surface 30a which is adjacent to the first semiconductor chip 10 when viewed in the first direction X.

The second semiconductor chips 30 may be disposed such that the second active surfaces 30a of the second semiconductor chips 30 face the first active surface 10a of the first semiconductor chip 10. The two second semiconductor chips 30 may be disposed to be separated from each other in such a manner that the side peripheries of the second active surfaces 30a at which the second bonding pads 32 are arranged overlap with the peripheral bonding pads 12a of the first semiconductor chip 10. The two second semiconductor chips 30 may be disposed to not overlap with the central bonding pads 12b of the first semiconductor chip 10. The peripheral bonding pads 12a of the first semiconductor chip 10 and the second bonding pads 32 of the second semiconductor chips 30 may be disposed to overlap with each other in a one-to-one correspondence.

The second semiconductor chips 30 may be a kind of chip that is different from the first semiconductor chip 10. For example, if the first semiconductor chip 10 is a logic chip, the second semiconductor chips 30 may be memory chips.

The first coupling members 40 may be respectively interposed between the peripheral bonding pads 12a of the first semiconductor chip 10 and the second bonding pads 32 of the second semiconductor chips 30 in such a way as to electrically couple the peripheral bonding pads 12a and the second bonding pads 32. The first coupling members 40 may be constructed by bumps. The first coupling members 40 may be formed on the second bonding pads 32 of the second semiconductor chips 30. The second semiconductor chips 30 may be flip-chip bonded to the first active surface 10a of the first semiconductor chip 10 by the first coupling members 40.

The second encapsulation member 50 may be formed to cover the second active surfaces 30a and second side surfaces 30c of the second semiconductor chips 30. The second encapsulation member 50 may be formed to not cover the second surfaces 30b of the second semiconductor chips 30. The second encapsulation member 50 may be formed to fill the region between the second semiconductor chips 30. The second encapsulation member 50 may be formed of an epoxy molding compound.

The mold vias 60 may be formed through portions of the second encapsulation member 50 between the second semiconductor chips 30 to pass through a second front surface 50a and a second back surface 50b of the second encapsulation member 50. The mold vias 60 may be coupled with the central bonding pads 12b, respectively, of the first semiconductor chip 10 on the second front surface 50a of the second encapsulation member 50.

The redistribution layer 110 may function as means for mounting a chip stack including the first and second semiconductor chips 10 and 30 to an external circuit. The redistribution layer 110 may include a first dielectric layer 112, redistribution lines 114, and a second dielectric layer 116. The redistribution layer 110 may further include redistribution pads 118. The redistribution layer 110 may be formed under the second surfaces 30b of the second semiconductor chips 30, the second back surface 50b of the second encapsulation member 50, and the mold vias 60.

The first dielectric layer 112 may be formed on or under the second surfaces 30b of the second semiconductor chips 30, the second back surface 50b of the second encapsulation member 50, and the mold vias 60. The first dielectric layer 112 may be formed under the second surfaces 30b of the second semiconductor chips 30 and the second back surface 50b. The first dielectric layer 112 may be formed a to leave exposed portions of the mold vias 60 which are disposed on the second back surface 50b of the second encapsulation member 50. The first dielectric layer 112 may serve as a stress buffer. The redistribution lines 114 may be formed on or under the first dielectric layer 112. The redistribution lines 114 may be formed in such a manner that one ends of the respective redistribution lines 114 are coupled with the mold vias 60 which are exposed through the first dielectric layer 112. The redistribution lines 114 may be constructed by, for example, copper wiring lines. The second dielectric layer 116 may be formed on or under the first dielectric layer 112 to cover the redistribution lines 114. The second dielectric layer 116 may be formed to leave exposed the other ends of the redistribution lines 114 facing away from the one ends. The redistribution pads 118 may be formed on or under the second dielectric layer 116. The redistribution pads 118 may be formed in such a way as to be coupled with the other ends, respectively, of the redistribution lines 114 which are exposed through the second dielectric layer 116.

The external coupling members 120 may be formed on or under the redistribution pads 118, respectively. The external coupling members 120 may be constructed by solder balls. Unlike this, the external coupling members 120 may be constructed by conductive pins or conductive pastes.

The stacked semiconductor package in accordance with the embodiment may have advantages the same as those of the embodiment illustrated in FIG. 1. In addition, because the stacked semiconductor package in accordance with the embodiment includes a redistribution layer instead of a substrate, an entire thickness may be reduced when compared to that of the embodiment illustrated in FIG. 1, and the manufacturing cost may be reduced through removal of the substrate.

The semiconductor packages in accordance with the above-described various embodiments may be applied to various kinds of electronic systems and memory cards.

Figure 5:
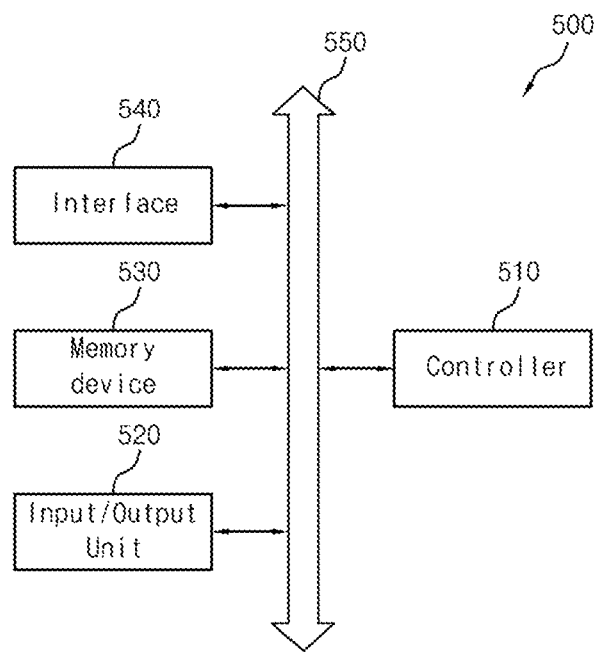
FIG. 5 is a block diagram illustrating a representation of an example of an electronic system to which the semiconductor packages in accordance with the various embodiments may be applied.

Referring to FIG. 5, an electronic system 500 may include the stacked semiconductor package according to the above-described various embodiments. The electronic system 500 may include a controller 510, an input and output (input/output) unit 520, and a memory device 530. The controller 510, the input/output unit 520, and the memory device 530 may be coupled with one another through a bus 550 which provides data movement paths.

For example, the controller 510 may include at least any one of a microprocessor, a digital signal processor, a microcontroller, and logic devices capable of performing similar functions to these components. The controller 510 and the memory device 530 may include the stacked semiconductor packages in accordance with the above-described various embodiments. The input/output unit 520 may include any one selected among a keypad, a keyboard, a display device, and so forth.

The memory device 530 may store data and/or commands to be executed by the controller 510. The memory device 530 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 500 may stably store a large amount of data in a flash memory system.

Such an electronic system 500 may further include an interface 540 for transmitting data to a communication network or receiving data from a communication network. The interface 540 may be a wired or wireless type. For example, the interface 540 may include an antenna or a wired/wireless transceiver.

Although not illustrated, the electronic system 500 may further include an application chipset, a camera image processor (CIP), and so forth.

The electronic system 500 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the case where the electronic system 500 is equipment capable of performing wireless communication, the electronic system 500 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution), and Wibro (wireless broadband Internet).

Figure 6:
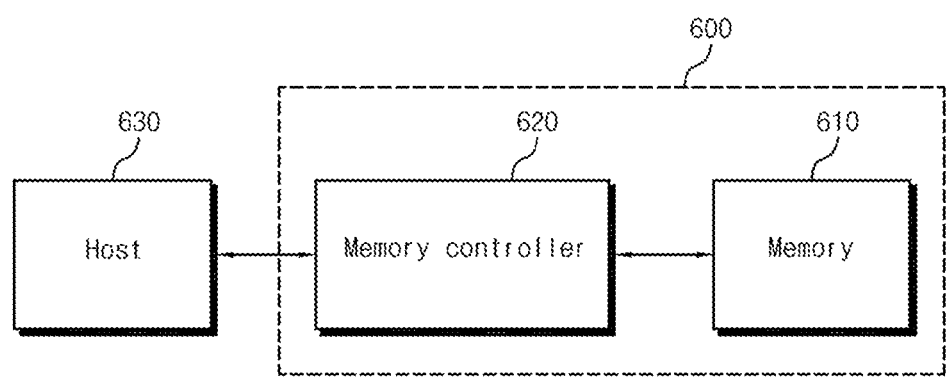
FIG. 6 is a block diagram illustrating a representation of an example of a memory card which may include the semiconductor packages in accordance with the various embodiments.

Referring to FIG. 6, a memory card may include the stacked semiconductor packages according to the above-described various embodiments. For instance, a memory card 600 may include a memory 610 such as a nonvolatile memory device and a memory controller 620. The memory 610 and the memory controller 620 may store data or read stored data. The memory 610 may include at least any one among nonvolatile memory devices to which the stacked semiconductor packages in accordance with the above-described various embodiments are applied. The memory controller 620 may control the memory 610 to read stored data or store data, in response to a read and write (read/write) request from a host 630.

Although various embodiments have been described for illustrative purposes, it will be apparent to those skilled in the art that various changes and modifications may be made without departing from the spirit and scope of the disclosure as defined in the following claims.

What is claimed is:

1. A stacked semiconductor package comprising:
   a first semiconductor chip having a first active surface over which first bonding pads including peripheral bonding pads and central bonding pad are arranged;
   a first encapsulation member formed over at least first side surfaces of the first semiconductor chip;
   two second semiconductor chips having second active surfaces over which second bonding pads are arranged at side peripheries adjacent to the first semiconductor chip, and disposed to be separated from each other such that the second active surfaces face the first active surface and the second bonding pads overlap with the peripheral bonding pads;
   first coupling members interposed between the peripheral bonding pads of the first semiconductor chip and the second bonding pads of the second semiconductor chips;
   a second encapsulation member formed over second side surfaces of the second semiconductor chips including a region between the second semiconductor chips; and
   a mold via formed through a portion of the second encapsulation member in the region between the second semiconductor chips and directly coupled with the central bonding pad of the first semiconductor chip,
   wherein the first encapsulation member has a first front surface which is coplanar with the first active surface of the first semiconductor chip and a first back surface which is coplanar with a first surface of the first semiconductor chip facing away from the first active surface, and
   wherein the second encapsulation member has a second front surface which is in contact with the first encapsulation member and a second back surface which is coplanar with second surfaces of the second semiconductor chips facing away from the second active surfaces.

2. The stacked semiconductor package according to claim 1, wherein the first semiconductor chip comprises a logic chip, and the second semiconductor chips comprise memory chips.

3. The stacked semiconductor package according to claim 1, wherein the second encapsulation member is formed to be in contact with the first semiconductor chip and the first encapsulation member.

4. The stacked semiconductor package according to claim 1, further comprising:
   bump pad formed under the mold via which are disposed at the second back surface of the second encapsulation member;
   dummy pads formed under the second surfaces of the second semiconductor chips;
   second coupling member formed under the bump pad; and
   support members formed under the dummy pads.

5. The stacked semiconductor package according to claim 4, further comprising:
   a substrate disposed to face the second surfaces of the second semiconductor chips and the second back surface of the second encapsulation member, and having a top surface over which bond finger to be electrically coupled with the second coupling member is arranged and a bottom surface under which electrode terminal to be electrically coupled with the bond finger is arranged.

6. The stacked semiconductor package according to claim 5, further comprising:
   a third encapsulation member formed over the top surface of the substrate to cover side surfaces of the first and second encapsulation members and fill spaces between the second semiconductor chips and the second encapsulation member and the top surface of the substrate; and
   external coupling member formed under the electrode terminal.

7. The stacked semiconductor package according to claim 5, further comprising:
   an underfill formed to fill spaces between the second surfaces of the second semiconductor chips and the second back surface of the second encapsulation member and the top surface of the substrate; and
   external coupling member formed under the electrode terminal.

8. The stacked semiconductor package according to claim 1, further comprising:
   a redistribution layer formed under the second surfaces of the second semiconductor chips, the second back surface of the second encapsulation member, and the mold via.

9. The stacked semiconductor package according to claim 8, wherein the redistribution layer comprises:
   a first dielectric layer formed under the second surfaces of the second semiconductor chips, the second back surface of the second encapsulation member, and the mold via in such a way as to leave exposed the mold via;
   redistribution line formed under the first dielectric layer such that one end of the redistribution line is coupled with the mold via which is exposed;
   a second dielectric layer formed under the first dielectric layer in such a way as to cover the redistribution line except the other end of the redistribution line facing away from the one end; and
   redistribution pad formed under the second dielectric layer in such a way as to be coupled with the other end of the redistribution line which is exposed.

10. The stacked semiconductor package according to claim 9, further comprising:

external coupling member formed under the redistribution pad.

* * * * *